United States Patent
Kravitz

(10) Patent No.: US 9,068,888 B2
(45) Date of Patent: Jun. 30, 2015

(54) OPTO-ISOLATION CIRCUIT HAVING A CONVERSION CIRCUIT CONTROLLED BY AN AUTONOMOUS CONTROL SIGNAL

(75) Inventor: Andrew S Kravitz, Erie, CO (US)

(73) Assignee: Micro Motion, Inc., Boulder, CO (US)

( * ) Notice: Subject to any disclaimer, the term of this patent is extended or adjusted under 35 U.S.C. 154(b) by 336 days.

(21) Appl. No.: 13/817,469

(22) PCT Filed: Sep. 13, 2010

(86) PCT No.: PCT/US2010/048590
§ 371 (c)(1),
(2), (4) Date: Feb. 18, 2013

(87) PCT Pub. No.: WO2012/036661
PCT Pub. Date: Mar. 22, 2012

(65) Prior Publication Data
US 2013/0240764 A1 Sep. 19, 2013

(51) Int. Cl.
H01J 40/14 (2006.01)
G01J 1/44 (2006.01)
H01L 31/02 (2006.01)
H04B 10/80 (2013.01)

(52) U.S. Cl.
CPC ............ *G01J 1/44* (2013.01); *H01L 31/02019* (2013.01); *H04B 10/802* (2013.01)

(58) Field of Classification Search
CPC ................ G01J 1/44; G01F 1/84; G01F 1/76; G08C 19/02
USPC ................ 250/214 R, 214.1, 577, 573, 576; 700/281, 282; 702/45; 356/73, 436
See application file for complete search history.

(56) References Cited

U.S. PATENT DOCUMENTS

| | | | |
|---|---|---|---|
| 6,351,691 B1 | 2/2002 | Mansfield | |
| 6,782,325 B2 | 8/2004 | Hays et al. | |
| 6,834,241 B2 | 12/2004 | Hays et al. | |
| 8,857,787 B2 * | 10/2014 | Zula | 251/129.04 |
| 2003/0010891 A1 | 1/2003 | Mizuhara et al. | |
| 2010/0213874 A1 | 8/2010 | Lee et al. | |

FOREIGN PATENT DOCUMENTS

| | | |
|---|---|---|
| DE | 102004049016 B3 | 8/2005 |
| SU | 1290388 A1 | 2/1987 |
| WO | 2010014085 A1 | 2/2010 |
| WO | 2010014089 A1 | 2/2010 |

* cited by examiner

*Primary Examiner* — Que T Le
(74) *Attorney, Agent, or Firm* — The Ollila Law Group LLC

(57) ABSTRACT

An opto-isolation circuit (300) is provided, including an optocoupler (303) configured to optically transfer a raw output signal, a conversion circuit (317) coupled to an optocoupler output and configured to convert the raw output signal into a predetermined converted signal, and a control circuit (306) coupled to the optocoupler output. The control circuit (306) is configured to generate an autonomous control signal from the raw output signal after the raw output signal passes through the optocoupler (303), wherein the autonomous control signal is generated only if the raw output signal exceeds a predetermined conversion threshold, and control the conversion circuit (317) and convert the raw output signal into the predetermined converted signal if the autonomous control signal is generated by the control circuit (306) and output the raw output signal to an output port if the autonomous control signal is not generated by the control circuit (306).

19 Claims, 5 Drawing Sheets

OPTO-ISOLATION CIRCUIT HAVING A CONVERSION CIRCUIT CONTROLLED BY AN AUTONOMOUS CONTROL SIGNAL

BACKGROUND OF THE INVENTION

1. Field of the Invention

The invention is related to the field of opto-isolation circuits, and in particular, to opto-isolation circuits capable of autonomously outputting at least two different signals.

2. Statement of the Problem

Coriolis mass flow meters measure mass flow and other information with respect to materials flowing through a pipeline. These flow meters typically comprise a flow meter electronics portion and a flow meter sensor portion. Flow meter sensors have one or more flow tubes of a straight or curved configuration. Each flow tube configuration has a set of natural vibration modes, which may be of a simple bending, torsional, radial, or coupled type. Each flow tube is driven to oscillate at resonance in one of these natural vibration modes. The natural vibration modes of the vibrating, material filled systems are defined in part by the combined mass of the flow tubes and the material within the flow tubes. When there is no material flowing through a Coriolis flow meter sensor, all points along the flow tubes oscillate with a substantially identical phase. As material flows through the flow tubes, Coriolis accelerations cause points along the flow tubes to have a different phase. The phase on the inlet side of the flow meter sensor lags the driver, while the phase on the outlet side of the flow meter sensor leads the driver.

FIG. 1 illustrates a Coriolis flow meter 5. Coriolis flow meter 5 comprises a Coriolis flow meter sensor 10 and Coriolis flow meter electronics 20. Flow meter electronics 20 is connected to flow meter sensor 10 via path 100 to provide for mass flow rate, density, volume flow rate, totalized mass flow information, and other information over path 26. Port 26 may output information, such as measurements generated by the flow meter 5.

The flow meter sensor 10 includes a pair of flanges 101 and 101', manifold 102, and flow tubes 103A and 103B. Connected to flow tubes 103A and 103B are a driver 104, pick-off sensors 105 and 105', and temperature sensor 107. Brace bars 106 and 106' serve to define the axis W and W' about which each flow tube 103A and 103B oscillates. Although a dual tube, curved meter is shown, it should be understood that the discussion herein will equally apply to a meter having a single tube or a meter having a straight tube or tubes.

When flow meter sensor 10 is inserted into a pipeline system (not shown), the material of the pipeline enters the flow meter sensor 10 through the flange 101, passes through the manifold 102, where the material is directed to enter the flow tubes 103A and 103B, flows through the flow tubes 103A and 103B and back into the manifold 102 from where it exits the flow meter sensor 10.

The flow tubes 103A and 103B are selected and appropriately mounted to the manifold 102 to have substantially the same mass distribution, moments of inertia, and elastic modules about the bending axes W-W and W'-W', respectively. The flow tubes 103A-103B extend outwardly from the manifold 102 in an essentially parallel fashion.

The flow tubes 103A-103B are driven by the driver 104 in opposite directions about their respective bending axes W and W' at what is termed the first out of phase bending mode of the flow meter 5. The driver 104 may comprise any one of many well known arrangements, such as a magnet mounted to flow tube 103A and an opposing coil mounted to flow tube 103B and through which an alternating current is passed for vibrating both flow tubes. A suitable drive signal is applied by the flow meter electronics 20, via lead 110, to the driver 104.

The pick-off sensors 105 and 105' are affixed to at least one of flow tubes 103A and 103B on opposing ends of the flow tube to measure the oscillation of the flow tubes. As the flow tubes 103A-103B vibrate, the pick-off sensors 105-105' generate a first pick-off signal and a second pick-off signal. The first and second pick-off signals are applied to the leads 111 and 111'.

The temperature sensor 107 is affixed to at least one of the flow tubes 103A and 103B. The temperature sensor 107 measures the temperature of the flow tube in order to modify equations for the temperature of the system. The path 112 carries temperature signals from the temperature sensor 107 to the flow meter electronics 20.

The flow meter electronics 20 receive the first and second pick-off signals appearing on the leads 111 and 111', respectively. The flow meter electronics 20 process the first and second pick-off signals to compute the mass flow rate, the density, and/or other properties of the material passing through the flow meter sensor 10. This computed information is applied by the meter electronics 20 over the path 26, such as to an external device or devices.

FIG. 2 shows a typical prior art output circuit that can be used to generate a flow meter output in one of two communication formats. The figure includes two optocouplers, where the optocouplers comprise an electrical isolation between the meter electronics 20 and the output port 26, for example. This may be done to limit electrical power consumption, for example, wherein the meter electronics 20 (and/or the flow meter assembly 10) cannot draw electrical power beyond the capacity of the isolation device. This protects against damage in the event of an electrical short, for example. This may be done where the flow meter 5 is used in an explosive or hazardous environment. The isolation may be part of an intrinsic safety (IS) construction of the meter electronics 20, wherein the barrier may prevent excessive electrical power from being transferred across the barrier and between safe and hazardous areas.

In the figure, the upper optocoupler is used to transfer the signal from the input to the output. Because the signal may be converted into at least one other communication format, the output may include a conversion circuit. As a result, the output of the upper optocoupler can be selectively provided to the conversion circuit, dependent on a control signal.

The control signal is provided by the meter electronics 20. The control signal therefore can be the result of a command or data that is stored in memory in the meter electronics 20, wherein a processor or other circuitry sends the resulting control signal to the lower optocoupler. Alternatively, the control signal can be received from an external device and relayed to the lower optocoupler.

In the prior art, the lower optocoupler passes the control signal. The control signal is used to select the output format by selecting the conversion circuit. If the control signal does not select the conversion circuit, then the signal is outputted as-is (i.e., a "raw" signal). If the conversion circuit is selected, the conversion circuit converts the signal into a new format that is available at the output.

Opto-isolation may be used for IS applications where the meter electronics 20 and one or more external devices are in communication. Opto-isolation may be used for IS applications where the meter electronics 20 must communicate across a barrier between safe and hazardous areas. Unfortunately, suitable optocouplers are expensive and large. Further, each optocoupler consumes electrical power.

For the meter electronics 20 of FIG. 1, two ten millimeter optocouplers may be utilized to generate both the desired raw signal and control signal, as shown in FIG. 2. This is costly both in terms of component costs and board real estate, because such optocouplers are large and expensive components.

What is needed, therefore, is an improved opto-isolation circuit that does not require a separate control signal.

Aspects of the Invention

In one aspect of the invention, an opto-isolation circuit comprises:
- an optocoupler configured to optically transfer a raw output signal;
- a conversion circuit coupled to an optocoupler output and configured to convert the raw output signal into a predetermined converted signal; and
- a control circuit coupled to the optocoupler output and configured to:
  - generate an autonomous control signal from the raw output signal after the raw output signal passes through the optocoupler, wherein the autonomous control signal is generated only if the raw output signal exceeds a predetermined conversion threshold; and
  - control the conversion circuit and convert the raw output signal into the predetermined converted signal if the autonomous control signal is generated by the control circuit and output the raw output signal to an output port if the autonomous control signal is not generated by the control circuit.

Preferably, the predetermined conversion threshold comprises a predetermined energy threshold.

Preferably, the predetermined conversion threshold comprises a predetermined frequency threshold.

Preferably, the predetermined conversion threshold comprises a predetermined frequency threshold of about 2 kHz or greater.

Preferably, the raw output signal comprises a square wave and the frequency of the raw output signal conveys information.

Preferably, the raw output signal comprises a square wave and the frequency of the raw output signal conveys information, wherein the raw output signal is generated by a pickoff sensor.

Preferably, the raw output signal comprises a frequency-modulated square wave signal and the predetermined converted signal comprises a current-modulated signal.

Preferably, the raw output signal comprises a sensor time period (STP) mode signal comprising a frequency-modulated square wave signal and the predetermined converted signal comprises a milliamp output (MAO) mode signal comprising a current-modulated signal.

Preferably, the opto-isolation circuit further comprises a switch coupled to the optocoupler output and switching between the output port and the conversion circuit, with the conversion circuit being coupled to the switch and the output port, wherein the switch is controlled by the control circuit.

Preferably, the control circuit comprises a first amp U1 including a U1 input coupled to a first node N1 and a U1 output coupled to a second node N2, with the first amp U1 generating a predetermined positive output voltage when a U1 input voltage exceeds a predetermined U1 threshold, a first capacitor C1 coupled to the first node N1 and passing the raw output signal to the first node N1, a first resistor R1 coupled between the first node N1 and ground, with the first capacitor C1 and the first resistor R1 determining a pulse width of a square wave generated by the first amp U1, a diode D1 connected between the second node N2 and a third node N3 and forward biased by the first amp U1, a second resistor R2 coupled between the third node N3 and a fourth node N4, a second amp U2 including a U2 input coupled to the fourth node N4 and a U2 output providing the autonomous control signal when a U2 input voltage exceeds a predetermined U2 threshold, a second capacitor C2 connected between the fourth node N4 and the ground, and a third resistor R3 coupled between the fourth node N4 and the ground, wherein the first resistor R1, the first capacitor C1, the second resistor R2, the second capacitor C2, and the third resistor R3 are selected so that the second amp U2 triggers when the raw output signal exceeds the predetermined conversion threshold, creating the autonomous control signal.

In one aspect of the invention, a method of transferring a raw output signal through an optocoupler comprises:
- transferring the raw output signal through the optocoupler;
- generating an autonomous control signal from the raw output signal after the raw output signal passes through the optocoupler, wherein the autonomous control signal is generated only if the raw output signal exceeds a predetermined conversion threshold; and
- converting the raw output signal into a predetermined converted signal if the autonomous control signal is generated and outputting the raw output signal to an output port if the autonomous control signal is not generated.

Preferably, the predetermined conversion threshold comprises a predetermined energy threshold.

Preferably, the predetermined conversion threshold comprises a predetermined frequency threshold.

Preferably, the predetermined conversion threshold comprises a predetermined frequency threshold of about 2 kHz or greater.

Preferably, the raw output signal comprises a square wave and the frequency of the raw output signal conveys information.

Preferably, the raw output signal comprises a square wave and the frequency of the raw output signal conveys information, wherein the raw output signal is generated by a pickoff sensor.

Preferably, the raw output signal comprises a frequency-modulated square wave signal and the predetermined converted signal comprises a current-modulated signal.

Preferably, the raw output signal comprises a sensor time period (STP) mode signal comprising a frequency-modulated square wave signal and with the predetermined converted signal comprising a milliamp output (MAO) mode signal comprising a current-modulated signal.

Preferably, the method further comprises switching between an output port and a conversion circuit, with the conversion circuit being coupled to a switch and the output port and with the conversion circuit generating the predetermined converted signal.

DESCRIPTION OF THE DRAWINGS

The same reference number represents the same element on all drawings.

DETAILED DESCRIPTION OF THE INVENTION

FIGS. 1-5 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
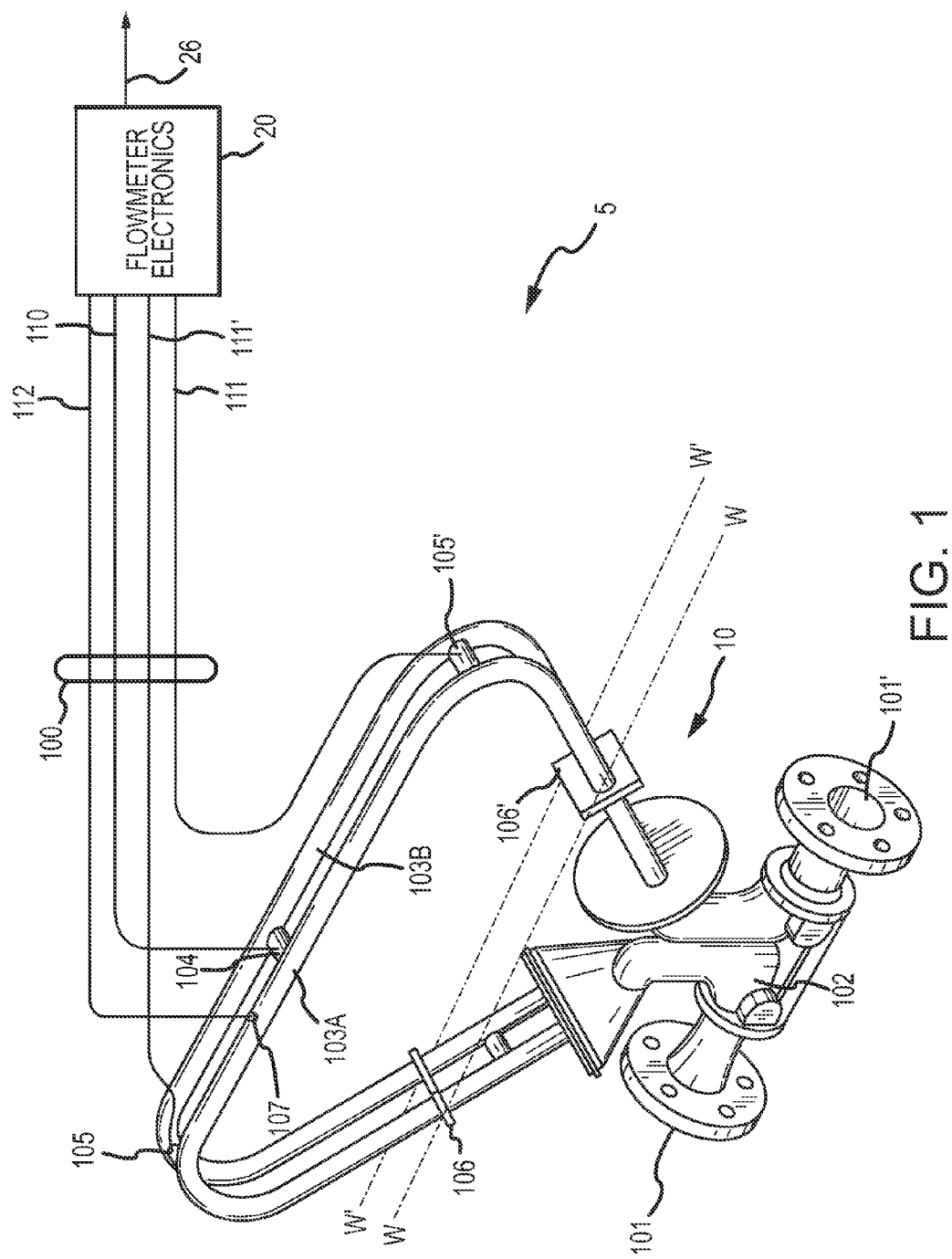
FIG. 1 shows a Coriolis flow meter.
Figure 2:
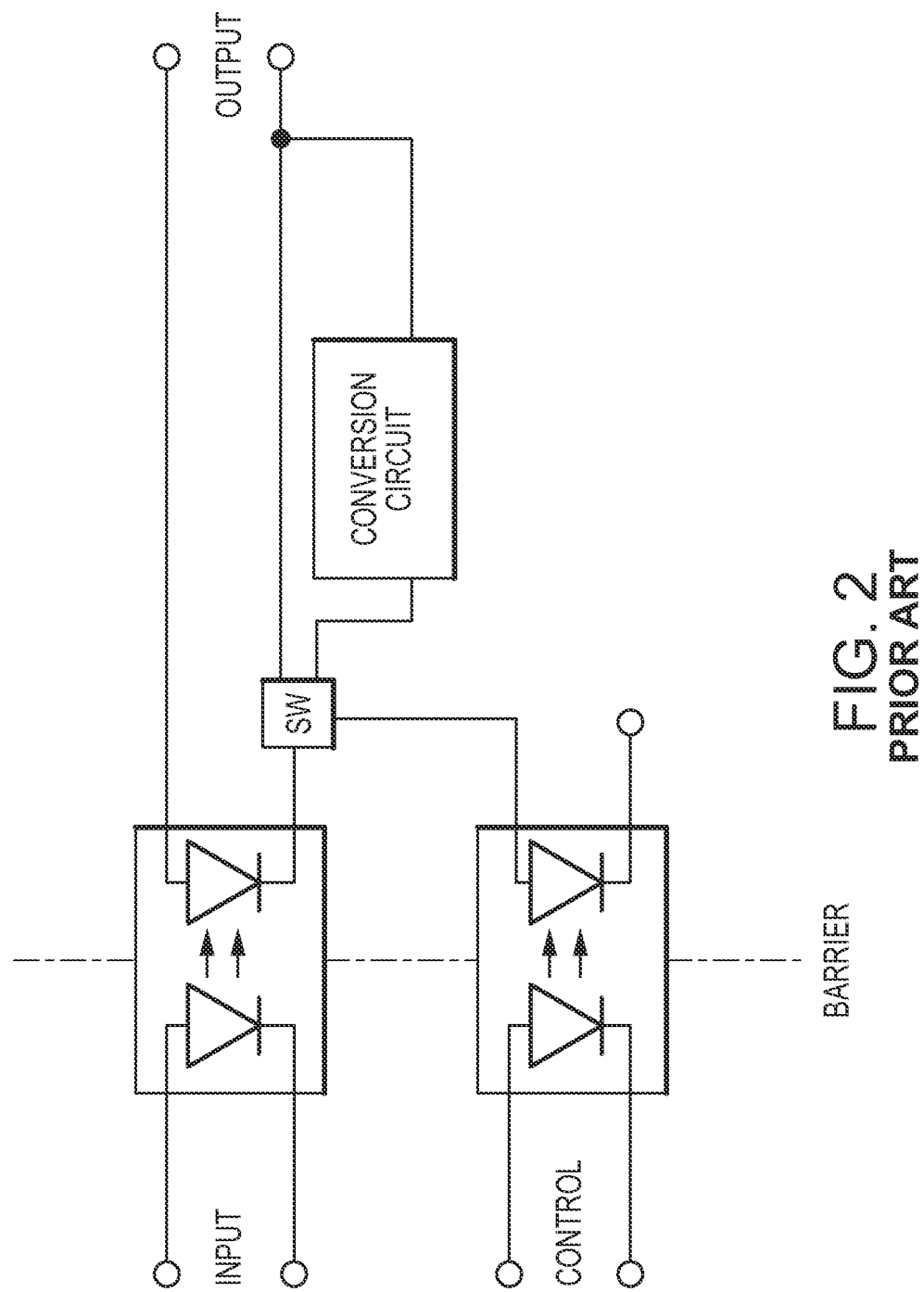
FIG. 2 shows a typical prior art output circuit that can be used to generate a flow meter output in one of two communication formats.
Figure 3:
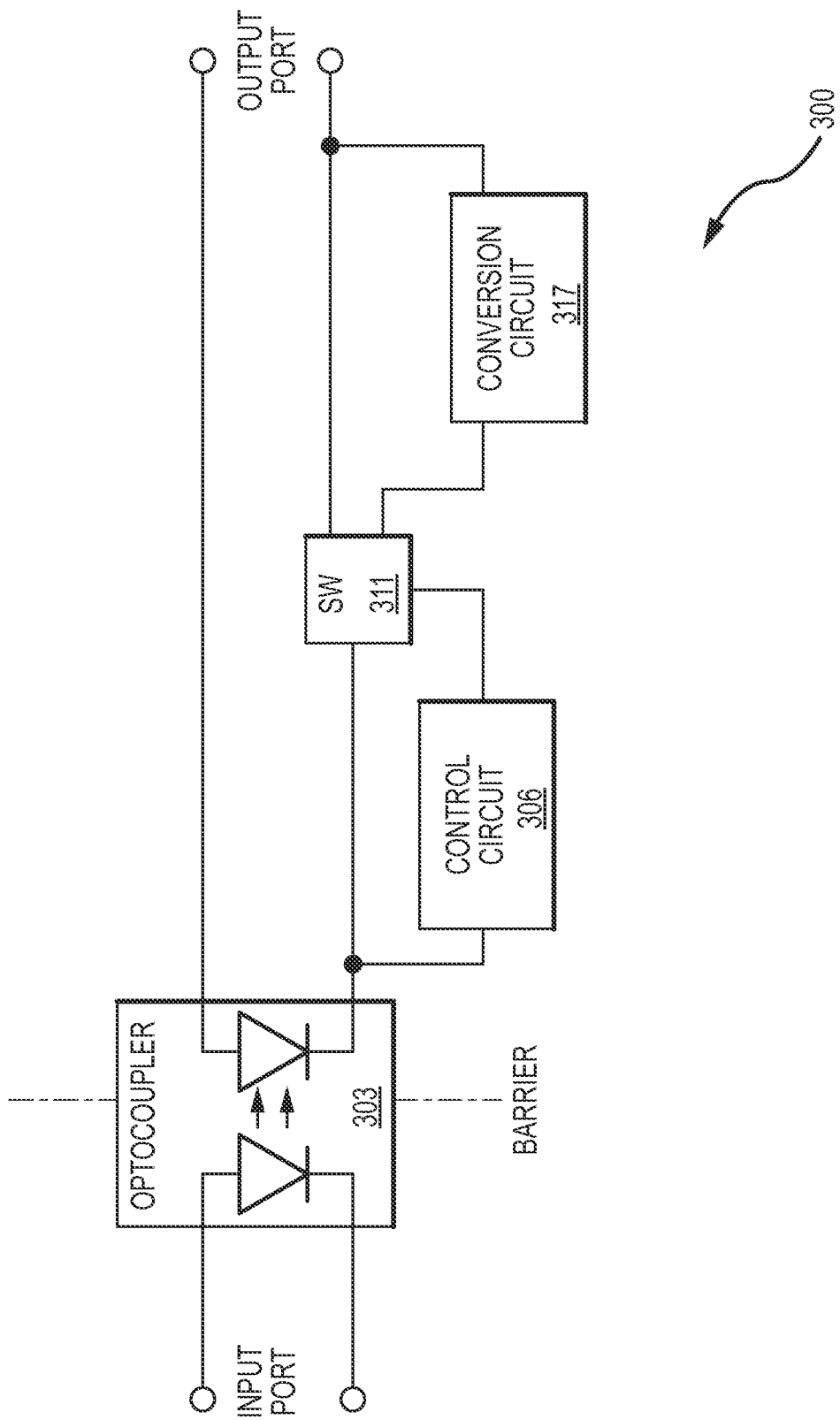
FIG. 3 shows an opto-isolation circuit according to an embodiment of the invention.

FIG. 3 shows an opto-isolation circuit 300 according to an embodiment of the invention. The opto-isolation circuit 300 receives and transfers a raw output signal. The raw output signal can comprise a measurement output of a Coriolis flow meter 5 in some embodiments. The opto-isolation circuit 300 includes a single optocoupler 303 including an input port and an output port, a control circuit 306 coupled to the optocoupler output, a switch 311 coupled to the optocoupler output and to the control circuit 306, and a conversion circuit 317 coupled to the switch 311.

In some embodiments, the raw output signal comprises a frequency-modulated square wave signal and the predetermined converted signal comprises a current-modulated signal. In some embodiments, the raw output signal comprises a sensor time period (STP) mode signal comprising a frequency-modulated square wave signal and the predetermined converted signal comprises a milliamp output (MAO) mode signal comprising a current-modulated signal. However, it should be understood that other communication formats or other communication arrangements are contemplated and are within the scope of the description and claims.

The raw output signal may comprise a frequency-modulated square-wave signal. However, the meter electronics 20 may generate a raw output signal that differs according to the configuration/operation of the meter electronics 20. When the meter electronics 20 is running in the STP mode, the raw output signal will typically comprise a square wave signal in the range of 50-700 Hz with a fifty percent duty cycle. When the meter electronics 20 is running in the MAO mode, the actual output signal (i.e., the converted signal) is a current-modulated signal with a range of 1-24 mA, while the raw output signal typically is a 10 kHz carrier, pulse width modulated (PWM) square wave with a duty cycle that may vary typically from four percent to ninety-six percent. As a result, the opto-isolation circuit 300 can be configured to autonomously generate a desired output based on the raw output signal.

The opto-isolation circuit 300 is autonomous and transfers the raw output signal without need of an external control signal. The opto-isolation circuit 300 is autonomous and transfers the raw output signal without the need for transferring a control signal in parallel with the raw output signal, such as through a second optocoupler, as is done in the prior art. The opto-isolation circuit 300 receives the raw output signal and autonomously converts the raw output signal, using the raw output signal to control the conversion of the raw output signal. The opto-isolation circuit 300 autonomously outputs at least two different signals at the output port.

The optocoupler 303 receives the raw output signal at the input port and transfers the raw output signal to the optocoupler output. The transfer is accomplished optically, wherein the optocoupler provides electrical isolation between the circuitry connected to the input port and the circuitry connected to the output port. The electrical isolation prevents excessive electrical current consumption. The electrical isolation prevents damage to the circuitry. The electrical isolation prevents electrical power transfer at a level that could provide ignition in an explosive or hazardous environment.

The optocoupler 303 can comprise a component of an intrinsic safety (IS) device. The IS scheme can include circuitry to limit the consumption of electrical power. The IS scheme can include a physical barrier or barriers that separate safe and hazardous areas. The optocoupler 303 can comprise a device configured to pass data through a barrier, but without passing electrical current through the barrier in some embodiments.

The raw output signal is available at the optocoupler output. However, a different communication format may be desired. To this end, the conversion circuit 317 is coupled to the optocoupler output through the switch 311. By use of the switch 311, the communication format can be selectively changed to a predetermined converted signal that is outputted by the conversion circuit 317.

The control circuit 306 is configured to generate an autonomous control signal from the raw output signal after the raw output signal passes through the optocoupler 303. The autonomous control signal is generated only if the raw output signal exceeds a predetermined conversion threshold. The control circuit 306 is configured to control the conversion circuit 317 and convert the raw output signal into the predetermined converted signal if the autonomous control signal is generated by the control circuit 306 and output the raw output signal if the autonomous control signal is not generated by the control circuit 306.

The control circuit 306 controls the conversion circuit 317 by operating the switch 311. In some embodiments, the control circuit 306 controls operation of the switch 311 by either generating or not generating the autonomous control signal. The control circuit 306 therefore causes the outputting of either the raw output signal or the predetermined converted signal. The autonomous control signal is provided to, and operates, the switch 311.

The predetermined conversion threshold comprises a predetermined energy threshold in some embodiments. Alternatively, the predetermined conversion threshold may comprise a predetermined frequency threshold. For example, the predetermined conversion threshold may comprise a predetermined frequency threshold of about 2 kHz or greater.

In some embodiments, the autonomous control signal is generated as a function of frequency of the raw output signal. The predetermined conversion threshold may comprise a predetermined voltage level accumulated over a predetermined time period, with the predetermined time period corresponding to a predetermined frequency. Where the raw output signal is less than a predetermined minimum frequency value, the control circuit 306 generates the autonomous control signal. Otherwise, the control circuit 306 does not generate the autonomous control signal. In some embodiments, the predetermined frequency threshold can comprise a frequency in a range of about 2 kilohertz (kHz) to about 10 kHz, as the raw output signal will typically be less than 2 kHz for a STP signal and will typically be 10 kHz or greater for a MAO signal.

In some embodiments, the autonomous control signal is generated as a function of electrical energy of the raw output signal. The predetermined conversion threshold may comprise an energy content accumulated over a predetermined time period. Where the raw output signal is less than a predetermined conversion threshold, as determined in an energy accumulation or integration circuit, for example, then the control circuit 306 generates the autonomous control signal. Otherwise, the control circuit 306 does not generate the autonomous control signal.

It should be understood that the frequency of the raw output signal will be difficult to quantify. The prior art typically receives an external command for this reason, as the frequency of a variable duty cycle square wave pulse train is difficult to ascertain with accuracy and reliability. The frequency is even more difficult to determine when it is frequently and/or rapidly changing. For these reasons, and because the duty cycle may be changing, detecting peaks in the signal may not yield an acceptable frequency determination. As a result, the prior art relied on a separately generated control signal that had to be optically passed through an IS barrier.

In some embodiments, the raw output signal comprises a square wave and the frequency of the raw output signal conveys information. For example, the raw output signal may be generated by a pickoff sensor 105 or 105' of a Coriolis flow meter 5 or a vibrating densitometer 5.

Figure 4:
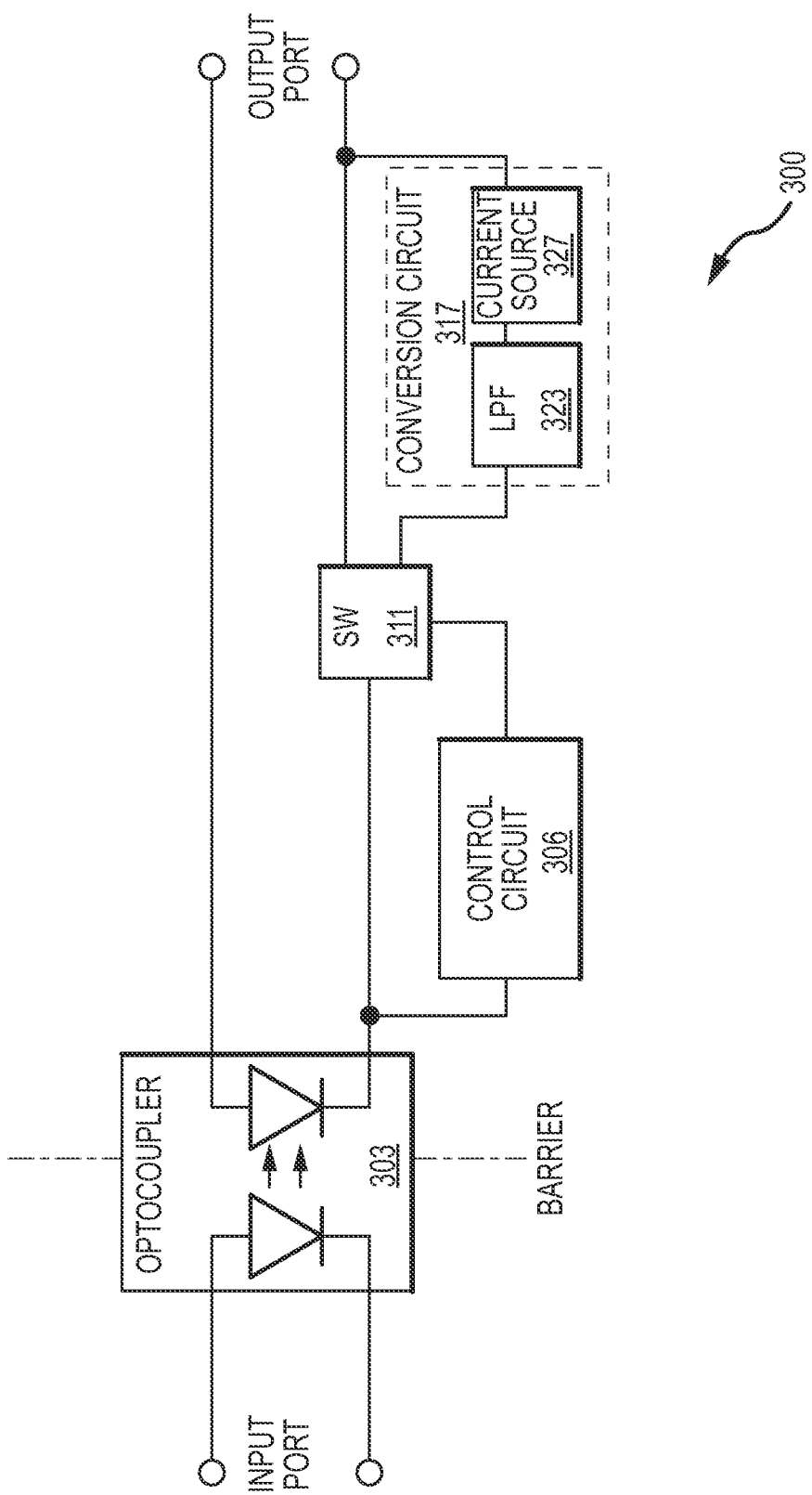
FIG. 4 shows the opto-isolation circuit wherein the conversion circuit comprises a low-pass filter (LPF) and a current source in one embodiment.

FIG. 4 shows the opto-isolation circuit 300 wherein the conversion circuit 317 comprises a low-pass filter (LPF) 323 and a current source 327 in one embodiment. The LPF 323 is configured to pass signals of a frequency below the predetermined conversion threshold. It should be understood that the LPF cutoff frequency does not have to substantially match the predetermined conversion threshold, and is included to prevent noise from being retained in the signal. The current source 327 is configured to convert a pulse-width modulation (PWM) square wave into a milliamp current version of the raw output signal. The converted milliamp current signal comprises a current-modulated signal. The converted milliamp current signal may be substantially analog in nature, in some embodiments. For example, the LPF 323 and the current source 327 may create a standard 4-20 milliamp output communications format, wherein the duty cycle of the raw output signal is translated into a milliamp level electrical current of between 4 and 20 milliamps. However, other current-modulated signals are contemplated and are within the scope of the description and claims.

Figure 5:
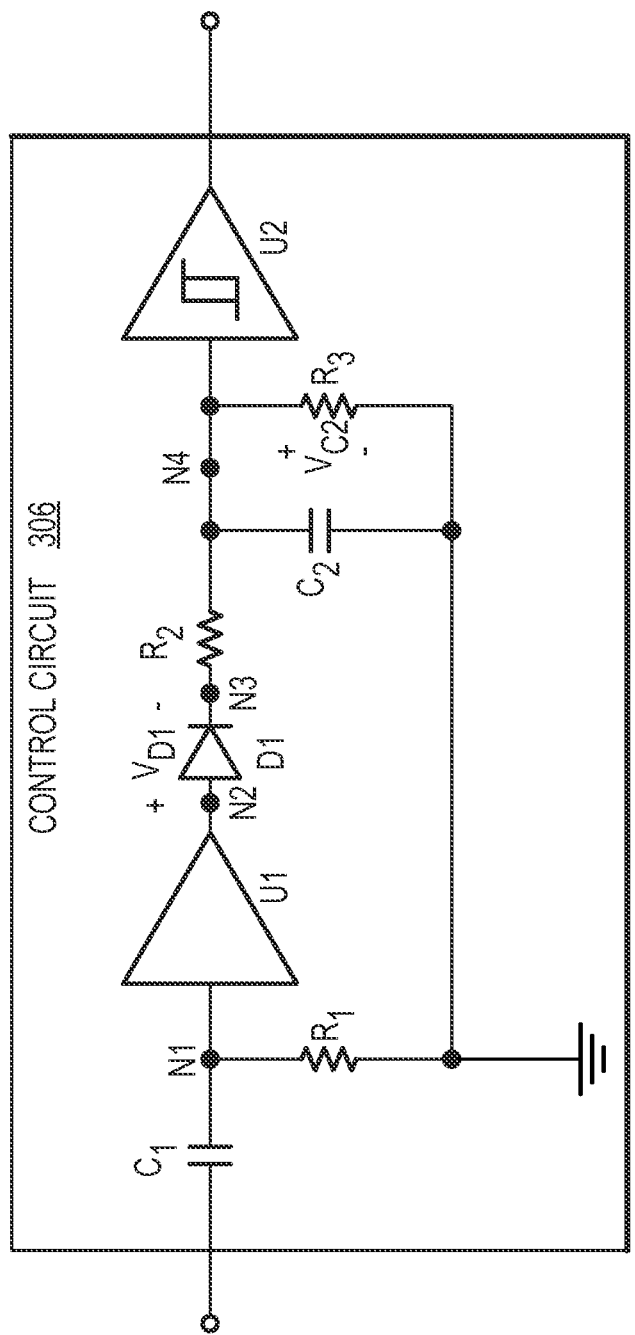
FIG. 5 shows the control circuit according to an embodiment of the invention.

FIG. 5 shows the control circuit 306 according to an embodiment of the invention. The control circuit 306 in this embodiment includes a first amp U1 including a U1 input coupled to a first node N1 and a U1 output coupled to a second node N2. The first amp U1 generates a predetermined positive output voltage when a U1 input voltage exceeds a predetermined U1 threshold. A first capacitor C1 is coupled to the first node N1 and passes the raw output signal to the first node N1. A first resistor R1 is coupled between the first node N1 and ground. The first capacitor C1 and the first resistor R1 determine a pulse width of a square wave generated by the first amp U1. A diode D1 is connected between the second node N2 and a third node N3 and is forward biased by the first amp U1. The diode D1 prevents the first amp U1 from producing a reverse bias voltage at the third node N3. A second resistor R2 is coupled between the third node N3 and a fourth node N4. A second amp U2 includes a U2 input coupled to the fourth node N4 and a U2 output that provides the autonomous control signal. A second capacitor C2 is connected between the fourth node N4 and the ground. A third resistor R3 is coupled between the fourth node N4 and the ground.

In operation, the combination of the first capacitor C1 and the first resistor R1 set the pulse width at which the first amp U1 will turn on. The combination of the second capacitor C2, the second resistor R2, and the third resistor R3 sets the voltage level at which the second amp U2 will turn on. Consequently, the second amp U2 will generate the autonomous control signal when the raw output signal, present at the input of the first amp U1, exceeds the predetermined conversion threshold.

In some embodiments, the first resistor R1, the first capacitor C1, the second resistor R2, the second capacitor C2, and the third resistor R3 are selected so that the second amp U2 triggers when the raw output signal exceeds the predetermined conversion threshold, creating the autonomous control signal. In some embodiments, the first resistor R1, the first capacitor C1, the second resistor R2, the second capacitor C2, and the third resistor R3 are selected so that a charge delivered by a pulse from the first amp U1 creates a C2 charge voltage that triggers the second amp U2 at a raw output signal frequency above the predetermined conversion threshold, creating the autonomous control signal.

The second amp U2 may include hysteresis, wherein a turn-on threshold of the second amp U2 on and the turn-off threshold are different. Consequently, a situation is avoided where the second amp U2 could oscillate between on and off states and create an unstable autonomous control signal.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention. Accordingly, the scope of the invention should be determined from the following claims.

What is claimed is:

1. An opto-isolation circuit (300), comprising:
   an optocoupler (303) configured to optically transfer a raw output signal;
   a conversion circuit (317) coupled to an optocoupler output and configured to convert the raw output signal into a predetermined converted signal; and
   a control circuit (306) coupled to the optocoupler output and configured to:
      generate an autonomous control signal from the raw output signal after the raw output signal passes through the optocoupler (303), wherein the autonomous control signal is generated only if the raw output signal exceeds a predetermined conversion threshold; and
      control the conversion circuit (317) and convert the raw output signal into the predetermined converted signal if the autonomous control signal is generated by the control circuit (306) and output the raw output signal to an output port if the autonomous control signal is not generated by the control circuit (306).

2. The opto-isolation circuit (300) of claim 1, with the predetermined conversion threshold comprising a predetermined energy threshold.

3. The opto-isolation circuit (300) of claim 1, with the predetermined conversion threshold comprising a predetermined frequency threshold.

4. The opto-isolation circuit (300) of claim 1, with the predetermined conversion threshold comprising a predetermined frequency threshold of about 2 kHz or greater.

5. The opto-isolation circuit (300) of claim 1, with the raw output signal comprising a square wave and with the frequency of the raw output signal conveying information.

6. The opto-isolation circuit (300) of claim 1, with the raw output signal comprising a square wave and with the frequency of the raw output signal conveying information, wherein the raw output signal is generated by a pickoff sensor.

7. The opto-isolation circuit (300) of claim 1, with the raw output signal comprising a frequency-modulated square wave signal and with the predetermined converted signal comprising a current-modulated signal.

8. The opto-isolation circuit (300) of claim 1, with the raw output signal comprising a sensor time period (STP) mode signal comprising a frequency-modulated square wave signal and with the predetermined converted signal comprising a milliamp output (MAO) mode signal comprising a current-modulated signal.

9. The opto-isolation circuit (300) of claim 1, further comprising a switch (311) coupled to the optocoupler output and switching between the output port and the conversion circuit (317), with the conversion circuit (317) being coupled to the switch (311) and the output port, wherein the switch (311) is controlled by the control circuit (306).

10. The opto-isolation circuit (300) of claim 1, with the control circuit (306) comprising:
a first amp U1 including a U1 input coupled to a first node N1 and a U1 output coupled to a second node N2, with the first amp U1 generating a predetermined positive output voltage when a U1 input voltage exceeds a predetermined U1 threshold;
a first capacitor C1 coupled to the first node N1 and passing the raw output signal to the first node N1;
a first resistor R1 coupled between the first node N1 and ground, with the first capacitor C1 and the first resistor R1 determining a pulse width of a square wave generated by the first amp U1;
a diode D1 connected between the second node N2 and a third node N3 and forward biased by the first amp U1;
a second resistor R2 coupled between the third node N3 and a fourth node N4;
a second amp U2 including a U2 input coupled to the fourth node N4 and a U2 output providing the autonomous control signal when a U2 input voltage exceeds a predetermined U2 threshold;
a second capacitor C2 connected between the fourth node N4 and the ground; and
a third resistor R3 coupled between the fourth node N4 and the ground;
wherein the first resistor R1, the first capacitor C1, the second resistor R2, the second capacitor C2, and the third resistor R3 are selected so that the second amp U2 triggers when the raw output signal exceeds the predetermined conversion threshold, creating the autonomous control signal.

11. A method of transferring a raw output signal through an optocoupler, the method comprising:
transferring the raw output signal through the optocoupler;
generating an autonomous control signal from the raw output signal after the raw output signal passes through the optocoupler, wherein the autonomous control signal is generated only if the raw output signal exceeds a predetermined conversion threshold; and
converting the raw output signal into a predetermined converted signal if the autonomous control signal is generated and outputting the raw output signal to an output port if the autonomous control signal is not generated.

12. The method of claim 11, with the predetermined conversion threshold comprising a predetermined energy threshold.

13. The method of claim 11, with the predetermined conversion threshold comprising a predetermined frequency threshold.

14. The method of claim 11, with the predetermined conversion threshold comprising a predetermined frequency threshold of about 2 kHz or greater.

15. The method of claim 11, with the raw output signal comprising a square wave and with the frequency of the raw output signal conveying information.

16. The method of claim 11, with the raw output signal comprising a square wave and with the frequency of the raw output signal conveying information, wherein the raw output signal is generated by a pickoff sensor.

17. The method of claim 11, with the raw output signal comprising a frequency-modulated square wave signal and with the predetermined converted signal comprising a current-modulated signal.

18. The method of claim 11, with the raw output signal comprising a sensor time period (STP) mode signal comprising a frequency-modulated square wave signal and with the predetermined converted signal comprising a milliamp output (MAO) mode signal comprising a current-modulated signal.

19. The method of claim 11, with the method further comprising switching between an output port and a conversion circuit, with the conversion circuit being coupled to a switch and the output port and with the conversion circuit generating the predetermined converted signal.

* * * * *